US010416237B2

(12) United States Patent
Clark

(10) Patent No.: US 10,416,237 B2
(45) Date of Patent: Sep. 17, 2019

(54) BATTERY SENSOR ASSEMBLY FOR USE IN AND ELECTRIC VEHICLE OR THE LIKE

(71) Applicant: David A. Clark, Madison, AL (US)

(72) Inventor: David A. Clark, Madison, AL (US)

(73) Assignee: Electricfil Corporation, Elkmont, AL (US)

( * ) Notice: Subject to any disclaimer, the term of this patent is extended or adjusted under 35 U.S.C. 154(b) by 65 days.

(21) Appl. No.: 15/707,078

(22) Filed: Sep. 18, 2017

(65) Prior Publication Data

US 2019/0086476 A1  Mar. 21, 2019

(51) Int. Cl.
| | |
|---|---|
| *G01R 31/36* | (2019.01) |
| *G01R 31/382* | (2019.01) |
| *G01K 7/02* | (2006.01) |
| *G01R 31/00* | (2006.01) |
| *G01R 31/392* | (2019.01) |
| *H01M 10/42* | (2006.01) |
| *H01M 10/48* | (2006.01) |
| *H01M 2/10* | (2006.01) |

(52) U.S. Cl.
CPC ............. *G01R 31/382* (2019.01); *G01K 7/02* (2013.01); *G01R 31/006* (2013.01); *G01R 31/392* (2019.01); *H01M 2/1077* (2013.01); *H01M 10/425* (2013.01); *H01M 10/486* (2013.01); *H01M 2010/4278* (2013.01); *H01M 2220/20* (2013.01)

(58) Field of Classification Search
None
See application file for complete search history.

(56) References Cited

U.S. PATENT DOCUMENTS

2010/0183904 A1* 7/2010 Muis ............... H01M 2/023
429/61

* cited by examiner

*Primary Examiner* — Clayton E. LaBalle
*Assistant Examiner* — Jas A Sanghera
(74) *Attorney, Agent, or Firm* — Clements Bernard Walker PLLC; Christopher L. Bernard; Richard A. Walker

(57) ABSTRACT

A battery sensor assembly utilizing a housing that resembles a battery, such that the battery sensor assembly may be disposed in a battery pack with adjacent batteries and electrically coupled to the adjacent batteries. The battery sensor assembly is operable for monitoring state of charge, voltage, state of health, temperature, and electrical current of the adjacent batteries in real time and measurements may be relayed to a central battery management system via a wireless or wired link.

15 Claims, 5 Drawing Sheets

BATTERY SENSOR ASSEMBLY FOR USE IN AND ELECTRIC VEHICLE OR THE LIKE

FIELD OF THE INVENTION

The present invention relates generally to a battery sensor assembly for use in an electric vehicle or the like. More specifically, the present invention relates to a battery sensor assembly utilizing a housing that resembles a battery, such that the battery sensor assembly may be disposed in a battery pack with adjacent batteries and electrically coupled to the adjacent batteries. The battery sensor assembly is operable for monitoring state of charge, voltage, state of health, temperature, and electrical current of the adjacent batteries in real time and measurements may be relayed to a central battery management system via a wireless or wired link.

BACKGROUND OF THE INVENTION

Battery packs containing multiple lithium ion batteries or the like are typically utilized in electric vehicles and the like. It is critically important to monitor the state of charge, voltage, state of health, temperature, and electrical current of these batteries in real time. Conventional devices and methods for performing such monitoring typically deploy a plurality of discrete sensors at various locations around a battery pack or provide a bulky integrated sensor module that is disposed adjacent to the battery pack. Discrete sensors, such as state of charge sensors, voltage sensors, humidity sensors, temperature sensors, current sensors, etc., are cost effective from a manufacturing standpoint, but research and development, validation, tooling, and supplier management are cost prohibitive for the aggregator. Likewise, integrated sensor modules, performing some or all of the above functions, are cost prohibitive for manufacturers and aggregators due to tooling, especially if different or custom integrated sensor modules must be used for different battery packs throughout an electric vehicle, for example.

Thus, what is still needed in the art is a robust battery sensor assembly that is readily incorporated into existing battery packs without the need for expensive research and development, validation, tooling, and supplier management, utilizing common existing battery pack frameworks.

BRIEF SUMMARY OF THE INVENTION

In various exemplary embodiments, the present invention provides a battery sensor assembly for use in an electric vehicle or the like. More specifically, the present invention provides a battery sensor assembly utilizing a housing that resembles a battery (whether cylindrical or rectangular), such that the battery sensor assembly may be readily disposed in a battery pack with adjacent batteries and electrically coupled to the adjacent batteries. The battery sensor assembly is operable for monitoring state of charge, voltage, state of health, temperature, and electrical current of the adjacent batteries in real time and measurements may be relayed to a central battery management system via a wireless or wired link. Thus, the battery sensor assembly of the present invention provides battery pack manufacturers and the like with the cost effectiveness of discrete sensors and the sensing capability of integrated sensor modules. Because the housing resembles a battery (18650 or 21700, for example), the battery sensor assembly is readily incorporated into any position within a battery pack, in a modular manner, and existing battery pack filling equipment may be used.

In one exemplary embodiment, the present invention provides a battery sensor assembly configured for use with a battery pack including one or more batteries, the battery sensor assembly including: a housing, wherein the housing has substantially the same shape and size as one of the one or more batteries of the battery pack; a support structure disposed within the housing; a circuit board coupled to the support structure; and one or more sensors coupled to the circuit board; wherein the one or more sensors are operable for measuring one or more conditions of at least one of the one or more batteries of the battery pack through the housing when the housing is disposed one of in and adjacent to the battery pack. Optionally, the housing has one of a substantially cylindrical shape and a substantially rectangular shape. The one or more sensors are configured to be selectively electrically coupled to the at least one of the one or more batteries of the battery pack through the housing. The one or more sensors are configured to be selectively thermally coupled to the at least one of the one or more batteries of the battery pack through the housing. The one or more sensors include one or more of a state of charge sensor, a voltage sensor, a state of health sensor, a temperature sensor, and an electrical current sensor. The one or more conditions include one or more of state of charge, voltage, state of health, temperature, and electrical current. The battery sensor assembly further includes one or more of a wireless antenna module and a wireline module disposed on the circuit board within the housing operable for communicating data from the one or more sensors to a central battery management system external to the housing.

In another exemplary embodiment, the present invention provides a battery sensor assembly configured for use with a battery pack including a plurality of batteries, the battery sensor assembly including: a housing, wherein the housing has substantially the same shape and size as two adjacent batteries of the plurality of batteries of the battery pack; a support structure disposed within the housing; a circuit board coupled to the support structure; and one or more sensors coupled to the circuit board; wherein the one or more sensors are operable for measuring one or more conditions of at least one of the plurality of batteries of the battery pack through the housing when the housing is disposed one of in and adjacent to the battery pack. Optionally, the housing has one of a dual substantially cylindrical shape and a dual substantially rectangular shape. The one or more sensors are configured to be selectively electrically coupled to the at least one of the one or more batteries of the battery pack through the housing. The one or more sensors are configured to be selectively thermally coupled to the at least one of the one or more batteries of the battery pack through the housing. The one or more sensors include one or more of a state of charge sensor, a voltage sensor, a state of health sensor, a temperature sensor, and an electrical current sensor. The one or more conditions include one or more of state of charge, voltage, state of health, temperature, and electrical current. The battery sensor assembly further includes one or more of a wireless antenna module and a wireline module disposed on the circuit board within the housing operable for communicating data from the one or more sensors to a central battery management system external to the housing.

In a further exemplary embodiment, the present invention provides a battery pack, including: one or more batteries; and a battery sensor assembly, including: a housing, wherein the housing has substantially the same shape and size as one or more of the one or more batteries of the battery pack; a support structure disposed within the housing; a circuit board coupled to the support structure; and one or more sensors coupled to the circuit board; wherein the one or more sensors are operable for measuring one or more conditions of at least one of the one or more batteries of the battery pack through the housing. Optionally, the housing has one of a substantially cylindrical shape, a substantially rectangular shape, a dual substantially cylindrical shape, and a dual substantially rectangular shape. The one or more sensors are configured to be selectively electrically coupled to the at least one of the one or more batteries of the battery pack through the housing. The one or more sensors are configured to be selectively thermally coupled to the at least one of the one or more batteries of the battery pack through the housing. The one or more sensors include one or more of a state of charge sensor, a voltage sensor, a state of health sensor, a temperature sensor, and an electrical current sensor. The one or more conditions include one or more of state of charge, voltage, state of health, temperature, and electrical current. The batter sensor assembly further includes one or more of a wireless antenna module and a wireline module disposed on the circuit board within the housing operable for communicating data from the one or more sensors to a central battery management system external to the housing.

BRIEF DESCRIPTION OF THE DRAWINGS

The present invention is illustrated and described herein with reference to the various drawings, in which like reference numbers are used to denote like assembly components/method steps, as appropriate, and in which.

DETAILED DESCRIPTION OF THE INVENTION

Again, in various exemplary embodiments, the present invention provides a battery sensor assembly for use in an electric vehicle or the like. More specifically, the present invention provides a battery sensor assembly utilizing a housing that resembles a battery (whether cylindrical or rectangular), such that the battery sensor assembly may be readily disposed in a battery pack with adjacent batteries and electrically coupled to the adjacent batteries. The battery sensor assembly is operable for monitoring state of charge, voltage, state of health, temperature, and electrical current of the adjacent batteries in real time and measurements may be relayed to a central battery management system via a wireless or wired link. Thus, the battery sensor assembly of the present invention provides battery pack manufacturers and the like with the cost effectiveness of discrete sensors and the sensing capability of integrated sensor modules. Because the housing resembles a battery (18650 or 21700, for example), the battery sensor assembly is readily incorporated into any position within a battery pack, in a modular manner, and existing battery pack filling equipment may be used.

Figure 1:
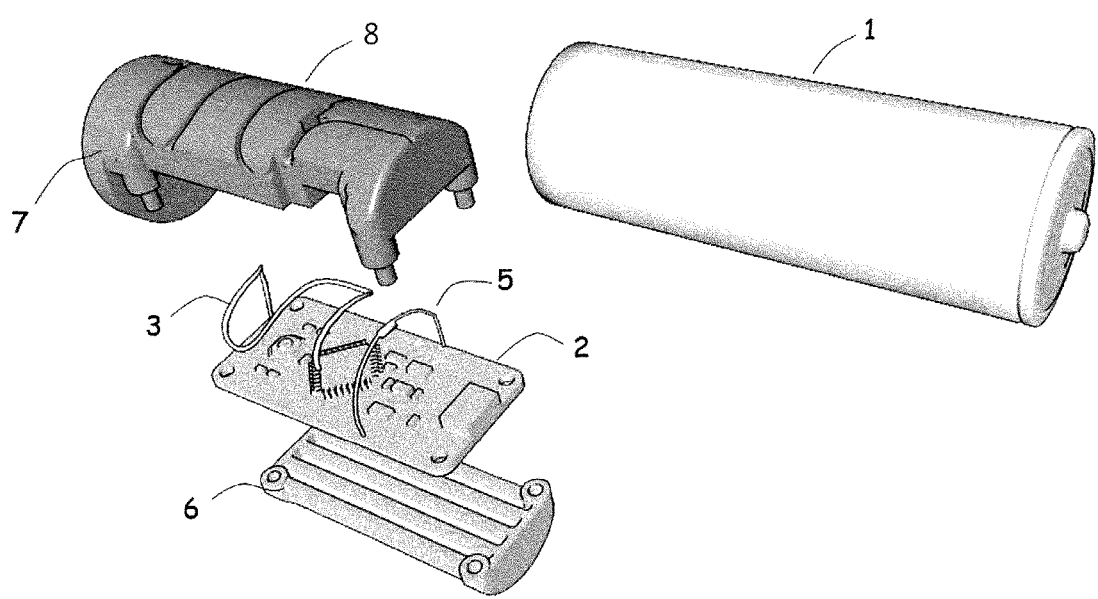
FIG. 1 is a perspective view of one exemplary embodiment of the battery sensor assembly of the present invention in a disassembled state.

Referring now specifically to FIG. 1, in one exemplary embodiment, the battery sensor assembly includes housing 1 that resembles a battery. This housing 1 may be cylindrical, rectangular, or the like and may resemble a 18650 battery, a 21700 battery, or the like. It will be readily apparent to those of ordinary skill in the art that any suitable shape and size housing 1 may be utilized, provided that the housing 1 resembles batteries with which it is ultimately disposed. Preferably, the housing 1 is constructed from a substantially rigid, environmentally sealed material, such that components disposed within the housing 1 are protected. Positive and/or negative contact terminals are provided at one or more of the opposed ends of the housing 1 for making appropriate electrical contacts, as with conventional batteries.

A circuit board 2 containing various sensors (or otherwise implementing various functionalities) is disposed within the housing 1. As alluded to above, these sensors may include, but are not limited to, a state of charge sensor, a voltage sensor, a state of health sensor, a temperature sensor, and an electrical current sensor. An exemplary state of charge sensor includes a voltage measurement device and microcontroller or application-specific integrated circuit (ASIC) capable of calculating a state of charge using a specific algorithm and/or from a lookup table. An exemplary voltage sensor includes an ASIC or analog-to-digital converter that is rated for a sensed voltage range. An exemplary state of health sensor includes a state of charge sensor coupled to a microcontroller that determines health based on a specific algorithm and/or a lookup table. An exemplary temperature sensor includes a thermistor or ASIC. An exemplary electrical current sensor includes a Hall effect sensor or the like that measures an electrical field as a function of current flow. It will be readily apparent to those of ordinary skill in the art that the housing 1 and circuit board 2 may contain any appropriate type of sensor (or implement any appropriate type of functionality) for measuring a condition of the adjacent batteries and/or battery pack in which everything is disposed. At least one end of the circuit board 2 includes a contact pad for electrically coupling the circuit board 2 to the contact terminal(s) of the housing 1. Optionally, an antenna 3 is provided to wirelessly link the circuit board 2 to an outside processor and display, described in greater detail herein below. Alternatively, the circuit board 2 includes a connector or the like accessible through an appropriate port in the housing 1 for providing a wired link to the outside processor and display.

The temperature sensor, when used, is functionalized by a thermocouple 5 (e.g. a wire) that is disposed at least partially adjacent to the interior surface of the housing 1 and coupled to the circuit board 2 at one or more ends, such that the temperature of or external to the housing 1 may be accurately sensed.

The circuit board 2 is held securely within the housing 1 by one or more support structures 6 and 7 made of plastic or the like. In this exemplary embodiment, a lower support structure 6 is disposed below the circuit board 2 and an upper support structure 7 is disposed above the circuit board 2, with the sensors being disposed within a recess manufactured into a lower surface of the upper support structure 7. These support structures 6 and 7 are coupled together via a plurality of pegs that pass through the circuit board 2. It will be readily apparent to those of ordinary skill in the art that other suitable support structures may be used equally, provided that the circuit board 2 and associated sensors are secured within the housing 1. Importantly, the support structures 6 and 7 at least partially conform to the shape of the interior volume of the housing 1. For example, the support structures may form a partially or wholly cylindrical insert (as illustrated), a partially or wholly rectangular insert, etc., depending upon the shape of the interior volume of the housing 1. In this exemplary embodiment, the upper support structure 7 includes a plurality of external recesses 8 for holding a portion of the antenna 3 and a portion of the thermocouple 5 close to the interior surface of the housing 1 to provide better wireless communication and temperature sensing, respectively.

To power the various sensors on the circuit board 2, a small battery (not illustrated in FIG. 1) may also be disposed within the housing 1. Other power options are available, as described in greater detail herein below.

Figure 2:
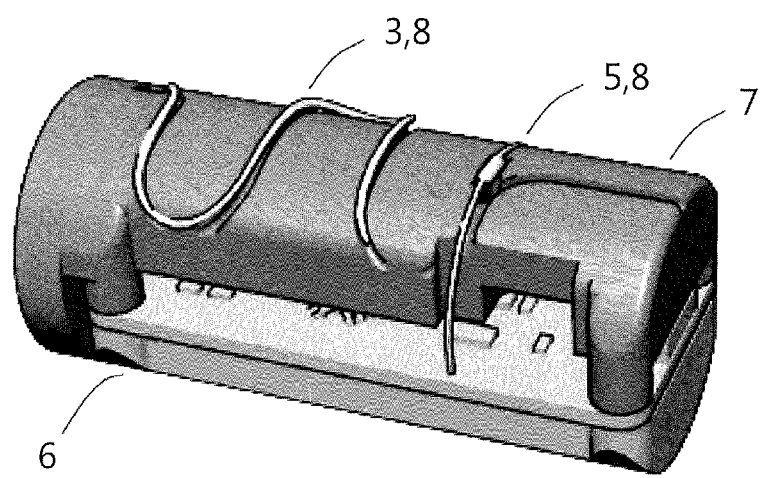
FIG. 2 is a perspective view of one exemplary embodiment of the battery sensor assembly of the present invention in a partially assembled state.

FIG. 2 illustrates the above exemplary embodiment of the battery sensor assembly of the present invention in a partially assembled state (minus the housing 1).

Figure 3:
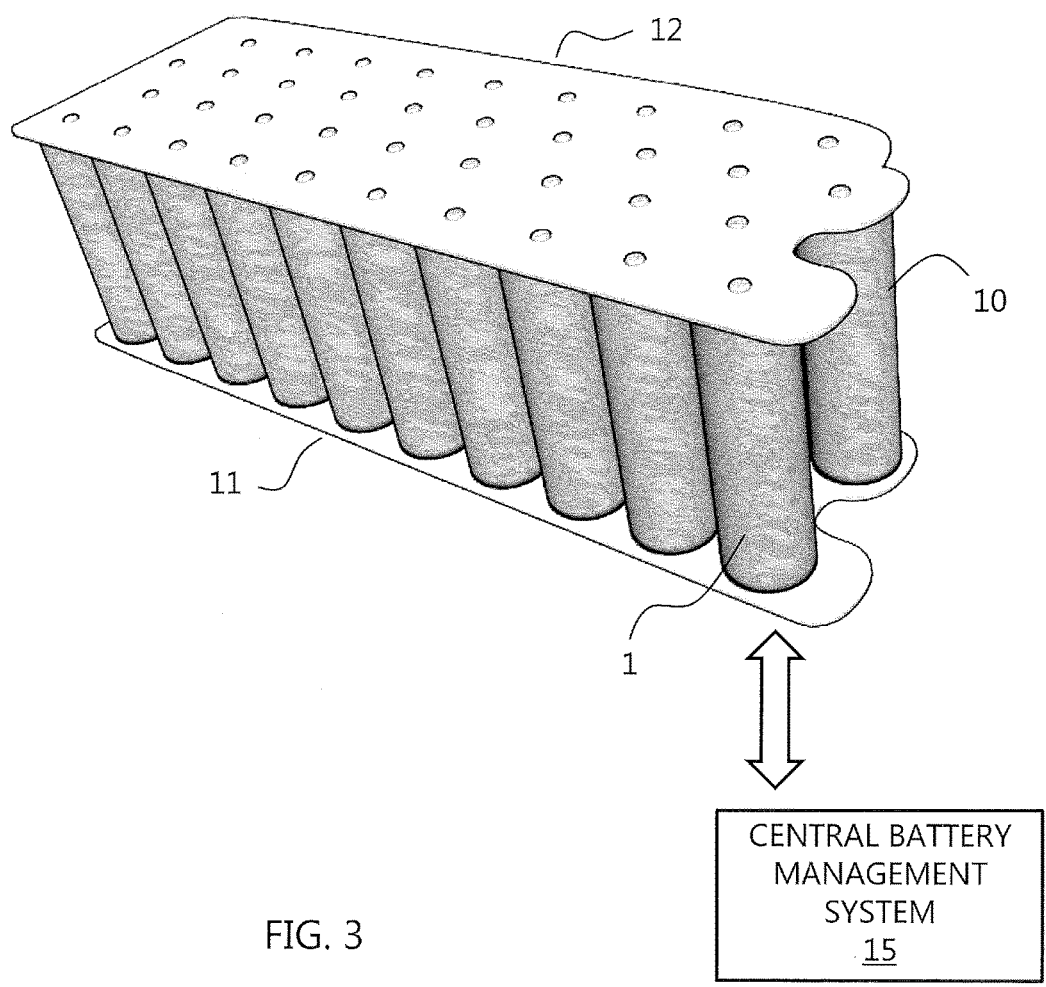
FIG. 3 is a perspective view of one exemplary embodiment of the battery sensor assembly of the present invention disposed in a conventional or novel battery pack with adjacent batteries that are monitored.

FIG. 3 illustrates the battery sensor assembly of the present invention disposed in a battery pack with adjacent batteries 10 that are being monitored by the battery sensor assembly. As is clear, the battery sensor assembly looks, and may be handled, like the adjacent batteries 10. The battery sensor assembly is coupled to the ground/negative voltage bus 11 and the positive voltage bus 12, as are the adjacent batteries 10. Accordingly, the sensors of the battery sensor assembly may be powered by the adjacent batteries, if voltage regulation constraints allow.

If wireless communication is selected as the desired mode of transmission, it is advantageous to place the batter sensor assembly arbitrarily within the battery pack as requested by a battery pack manufacturer and to use protocols and wavelengths available to the consumer market.

In general, the battery sensor assembly is wirelessly coupled or hardwired to a central battery management system 15 incorporating a processor and a display for determining and outputting the measurements of the state of charge sensor, the voltage sensor, the state of health sensor, the temperature sensor, the electrical current sensor, etc. This central battery management system 15 may be located proximate to or remote from the battery pack. For example, it may be located elsewhere in an electric vehicle or the like or it may be completely separate from the electric vehicle or the like. Appropriate battery management memory may be disposed within the housing 1 and/or provided as part of the central battery management system 15 to record monitoring activities and history.

Figure 4:
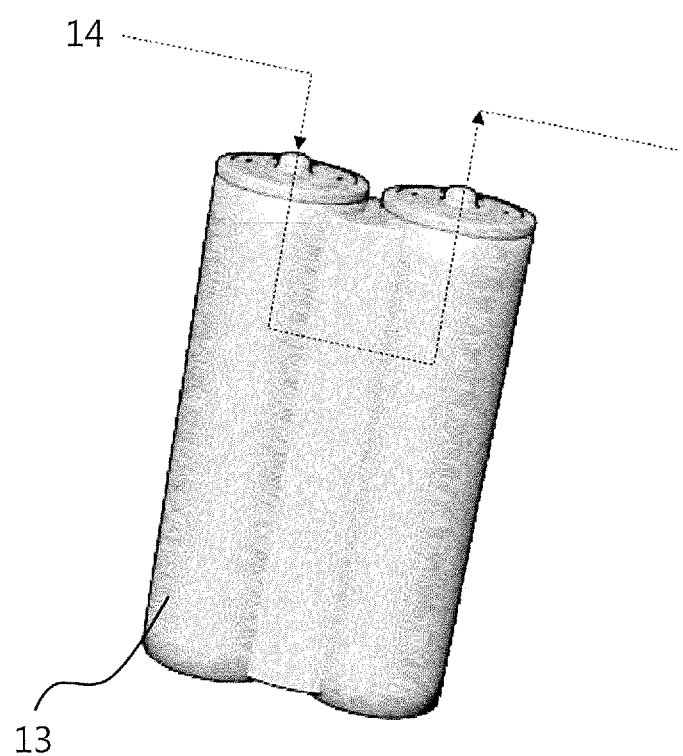
FIG. 4 is a perspective view of another exemplary embodiment of the battery sensor assembly of the present invention in an assembled state.

Referring now specifically to FIG. 4, in another exemplary embodiment, the battery sensor assembly includes housing 13 that resembles adjacent batteries (with an optional bridge member). This housing 13 may be dual cylindrical, dual rectangular, or the like and may resemble adjacent 18650 batteries, adjacent 21700 batteries, or the like. It will be readily apparent to those of ordinary skill in the art that any suitable shape and size housing 13 may be utilized, provided that the housing 13 resembles batteries with which it is ultimately disposed and mimics their spacing. Preferably, the housing 13 is constructed from a substantially rigid, environmentally sealed material, such that components disposed within the housing 13 are protected. Positive and/or negative contact terminals are provided at one or more of the opposed ends of the housing 13 for making appropriate electrical contacts, as with conventional batteries. In this exemplary embodiment, split terminals 14 aid in electrical current measurement.

Again, a circuit board 2 (FIG. 1) containing various sensors is disposed within the housing 13. As alluded to above, these sensors may include, but are not limited to, a state of charge sensor, a voltage sensor, a state of health sensor, a temperature sensor, and an electrical current sensor. An exemplary state of charge sensor includes a voltage measurement device and microcontroller or application-specific integrated circuit (ASIC) capable of calculating a state of charge using a specific algorithm and/or from a lookup table. An exemplary voltage sensor includes an ASIC or analog-to-digital converter that is rated for a sensed voltage range. An exemplary state of health sensor includes a state of charge sensor coupled to a microcontroller that determines health based on a specific algorithm and/or a lookup table. An exemplary temperature sensor includes a thermistor or ASIC. An exemplary electrical current sensor includes a Hall effect sensor or the like that measures an electrical field as a function of current flow. It will be readily apparent to those of ordinary skill in the art that the housing 13 and circuit board 2 may contain any appropriate type of sensor (or implement any appropriate type of functionality) for measuring a condition of the adjacent batteries and/or battery pack in which everything is disposed. At least one end of the circuit board 2 includes a contact pad for electrically coupling the circuit board 2 to the contact terminal(s) of the housing 13. Optionally, an antenna 3 (FIG. 1) is provided to wirelessly link the circuit board 2 to an outside processor and display, described in greater detail herein above. Alternatively, the circuit board 2 includes a connector or the like accessible through an appropriate port in the housing 13 for providing a wired link to the outside processor and display.

Again, the temperature sensor, when used, is functionalized by a thermocouple 5 (FIG. 1) (e.g. a wire) that is disposed at least partially adjacent to the interior surface of the housing 13 and coupled to the circuit board 2 at one or more ends, such that the temperature of or external to the housing 13 may be accurately sensed.

The circuit board 2 is held securely within the housing 13 by one or more support structures 6 (FIG. 1) and 7 (FIG. 1) made of plastic or the like. It will be readily apparent to those of ordinary skill in the art that any suitable support structures may be used equally, provided that the circuit board 2 and associated sensors are secured within the housing 13. Importantly, the support structures 6 and 7 at least partially conform to the shape of the interior volume(s) of the housing 13.

To power the various sensors on the circuit board 2, a battery (not illustrated in FIG. 4) may be disposed within one chamber of the housing 13. Other power options are available, as described in greater detail herein above and below.

Figure 5:
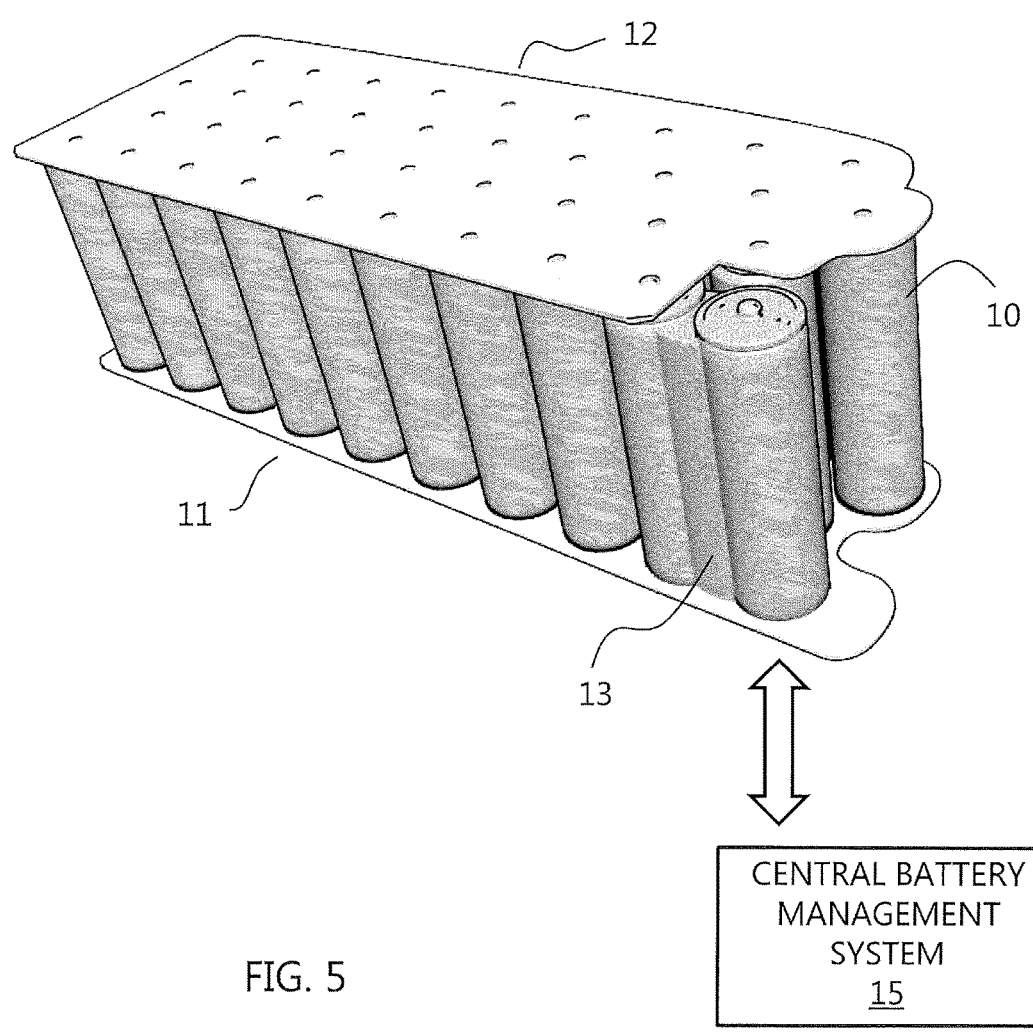
FIG. 5 is a perspective view of another exemplary embodiment of the battery sensor assembly of the present invention disposed in a conventional or novel battery pack with adjacent batteries that are monitored.

FIG. 5 illustrates the battery sensor assembly of the present invention disposed in a battery pack with adjacent batteries 10 that are being monitored by the battery sensor assembly. As is clear, the battery sensor assembly looks, and may be handled, like the adjacent batteries 10. The battery sensor assembly is coupled to the ground/negative voltage bus 11 and the positive voltage bus 12, as are the adjacent batteries 10. Accordingly, the sensors of the battery sensor assembly may be powered by the adjacent batteries, if voltage regulation constraints allow. In this exemplary embodiment, one half of the housing terminal is exposed and not in contact with the positive voltage bus 12 to aid in current detection.

Again, in general, the battery sensor assembly is wirelessly coupled or hardwired to a central battery management system 15 incorporating a processor and a display for determining and outputting the measurements of the state of charge sensor, the voltage sensor, the state of health sensor, the temperature sensor, the electrical current sensor, etc. This central battery management system 15 may be located proximate to or remote from the battery pack. For example, it may be located elsewhere in an electric vehicle or the like or it may be completely separate from the electric vehicle or the like. Again, appropriate battery management memory may be disposed within the housing 13 and/or provided as part of the central battery management system 15 to record monitoring activities and history.

Although the present invention is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following non-limiting claims for all purposes.

What is claimed is:

1. A battery sensor assembly configured for use with a battery pack comprising one or more batteries, the battery sensor assembly comprising:
   a housing, wherein the housing has substantially the same shape and size as one of the one or more batteries of the battery pack;
   a support structure disposed within the housing;
   a circuit board coupled to the support structure; and
   one or more sensors coupled to the circuit board;
   wherein the one or more sensors are operable for measuring one or more conditions of at least one of the one or more batteries of the battery pack through the housing when the housing is disposed one of in and adjacent to the battery pack; and
   wherein the one or more sensors are configured to be one or more of selectively electrically coupled and selectively thermally coupled to the at least one of the one or more batteries of the battery pack through the housing.

2. The battery sensor assembly of claim 1, wherein the housing has one of a substantially cylindrical shape and a substantially rectangular shape.

3. The battery sensor assembly of claim 1, wherein the one or more sensors comprise one or more of a state of charge sensor, a voltage sensor, a state of health sensor, a temperature sensor, and an electrical current sensor.

4. The battery sensor assembly of claim 1, wherein the one or more conditions comprise one or more of state of charge, voltage, state of health, temperature, and electrical current.

5. The battery sensor assembly of claim 1, further comprising one or more of a wireless antenna module and a wireline module disposed on the circuit board within the housing operable for communicating data from the one or more sensors to a central battery management system external to the housing.

6. A battery sensor assembly configured for use with a battery pack comprising a plurality of batteries, the battery sensor assembly comprising:
   a housing, wherein the housing has substantially the same shape and size as two adjacent batteries of the plurality of batteries of the battery pack;
   a support structure disposed within the housing;
   a circuit board coupled to the support structure; and
   one or more sensors coupled to the circuit board;
   wherein the one or more sensors are operable for measuring one or more conditions of at least one of the plurality of batteries of the battery pack through the housing when the housing is disposed one of in and adjacent to the battery pack; and
   wherein the one or more sensors are configured to be one or more of selectively electrically coupled and selectively thermally coupled to the at least one of the plurality of batteries of the battery pack through the housing.

7. The battery sensor assembly of claim 6, wherein the housing has one of a dual substantially cylindrical shape and a dual substantially rectangular shape.

8. The battery sensor assembly of claim 6, wherein the one or more sensors comprise one or more of a state of charge sensor, a voltage sensor, a state of health sensor, a temperature sensor, and an electrical current sensor.

9. The battery sensor assembly of claim 6, wherein the one or more conditions comprise one or more of state of charge, voltage, state of health, temperature, and electrical current.

10. The battery sensor assembly of claim 6, further comprising one or more of a wireless antenna module and a wireline module disposed on the circuit board within the housing operable for communicating data from the one or more sensors to a central battery management system external to the housing.

11. A battery pack, comprising:
    one or more batteries; and
    a battery sensor assembly, comprising:
       a housing, wherein the housing has substantially the same shape and size as one or more of the one or more batteries of the battery pack;
       a support structure disposed within the housing;
       a circuit board coupled to the support structure; and
       one or more sensors coupled to the circuit board;
       wherein the one or more sensors are operable for measuring one or more conditions of at least one of the one or more batteries of the battery pack through the housing; and
       wherein the one or more sensors are configured to be one or more of selectively electrically coupled and selectively thermally coupled to the at least one of the one or more batteries of the battery pack through the housing.

12. The battery pack of claim 11, wherein the housing has one of a substantially cylindrical shape, a substantially rectangular shape, a dual substantially cylindrical shape, and a dual substantially rectangular shape.

13. The battery pack of claim 11, wherein the one or more sensors comprise one or more of a state of charge sensor, a voltage sensor, a state of health sensor, a temperature sensor, and an electrical current sensor.

14. The battery pack of claim 11, wherein the one or more conditions comprise one or more of state of charge, voltage, state of health, temperature, and electrical current.

15. The battery pack of claim 11, further comprising one or more of a wireless antenna module and a wireline module disposed on the circuit board within the housing operable for communicating data from the one or more sensors to a central battery management system external to the housing.

* * * * *